(12) United States Patent
Moon et al.

(10) Patent No.: US 10,324,333 B2
(45) Date of Patent: Jun. 18, 2019

(54) COLOR POLARIZING FILM, ANTIREFLECTIVE FILM AND DISPLAY DEVICE

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Deuk Kyu Moon, Seoul (KR); Yong Joo Lee, Suwon-si (KR); Yoon-suk Kang, Gunsan-si (KR); Junghoon Lee, Seongnam-si (KR); Boreum Jeong, Daejeon (KR); Jonghyun Ha, Hwaseong-si (KR); Myungsup Jung, Seongnam-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/435,908

(22) Filed: Feb. 17, 2017

(65) Prior Publication Data

US 2017/0242296 A1   Aug. 24, 2017

(30) Foreign Application Priority Data

Feb. 22, 2016 (KR) .................. 10-2016-0020862

(51) Int. Cl.
*G02F 1/1335* (2006.01)
*C08L 23/12* (2006.01)
(Continued)

(52) U.S. Cl.
CPC ........ *G02F 1/133533* (2013.01); *C08L 23/12* (2013.01); *C08L 23/16* (2013.01);
(Continued)

(58) Field of Classification Search
CPC .............. C08J 2323/12; C08J 2323/14; C09B 67/0097; C09B 31/02; C09B 31/28;
(Continued)

(56) References Cited

U.S. PATENT DOCUMENTS 4,025,164 A * 5/1977 Doriguzzi ......... G02F 1/133533
349/97
4,859,039 A * 8/1989 Okumura ............... G02B 5/205
359/487.02
(Continued)

FOREIGN PATENT DOCUMENTS

KR  10-1078598 B1   10/2011
KR  2015-0082942 A   7/2015

OTHER PUBLICATIONS

Visible spectrum [online]. Wikipedia, 2018 [retrieved on Sep. 2, 2018]. Retrieved from the Internet:<URL: https://en.wikipedia.org/wiki /Visible_spectrum >. (Year: 2018) (Year: 2018).*

*Primary Examiner* — Sophie Hon
(74) *Attorney, Agent, or Firm* — Cantor Colburn LLP

(57) ABSTRACT

A color polarizing film including a first layer including a first polymer and a first dichroic dye having an absorption wavelength region of about 380 nm to about 780 nm and a second layer including a second polymer and a second dichroic dye having an absorption wavelength region of about 380 nm to about 780 nm, wherein the second layer is disposed on the first layer, wherein a polarization axis of the first layer and a polarization axis of a second layer cross each other, and wherein the color polarizing film exhibits a maximum absorption wavelength ($\lambda_{max}$) in a wavelength range of about 380 nm to about 780 nm.

30 Claims, 7 Drawing Sheets

(51) Int. Cl.

| | |
|---|---|
| *C08L 23/16* | (2006.01) |
| *C09B 31/02* | (2006.01) |
| *C09B 31/28* | (2006.01) |
| *G02F 1/13363* | (2006.01) |
| *H01L 51/52* | (2006.01) |
| *C09B 67/22* | (2006.01) |

(52) U.S. Cl.
CPC .............. *C09B 31/02* (2013.01); *C09B 31/28* (2013.01); *C09B 67/0046* (2013.01); *G02F 1/13363* (2013.01); *H01L 51/5281* (2013.01); *H01L 51/5293* (2013.01); *G02F 2001/133638* (2013.01); *G02F 2201/38* (2013.01); *G02F 2413/01* (2013.01); *Y10T 428/1041* (2015.01)

(58) Field of Classification Search
CPC . G02F 1/133533; G02F 2201/38; G02B 1/08; G02B 5/3025; G02B 5/305; H01L 27/322; Y10T 428/1041
See application file for complete search history.

(56) References Cited

U.S. PATENT DOCUMENTS

| | | | |
|---|---|---|---|
| 5,892,559 A * | 4/1999 | Sharp | ................ G02F 1/133533 349/119 |
| 2014/0016198 A1 | 1/2014 | Sawada et al. | |
| 2014/0126053 A1* | 5/2014 | Won | ................. G02F 1/133533 359/487.02 |
| 2015/0024149 A1 | 1/2015 | Watanabe et al. | |
| 2015/0177562 A1 | 6/2015 | Buchanan et al. | |
| 2015/0192700 A1 | 7/2015 | Won et al. | |

\* cited by examiner

COLOR POLARIZING FILM, ANTIREFLECTIVE FILM AND DISPLAY DEVICE

CROSS-REFERENCE TO RELATED APPLICATION

This application claims priority to Korean Patent Application No. 10-2016-0020862, filed in the Korean Intellectual Property Office on Feb. 22, 2016, and all the benefits accruing therefrom under 35 U.S.C. § 119, the content of which is incorporated herein in its entirety by reference.

BACKGROUND

1. Field

A color polarizing film, an antireflective film, and a display device are disclosed.

2. Description of the Related Art

A display device such as a liquid crystal display (LCD) and an organic light emitting diode (OLED) includes a polarizing plate attached to the outside of a display panel. The polarizing plate only transmits light of a specific wavelength and absorbs or reflects any other light of a different wavelength, thereby controlling the direction of incident light on the display panel or light emitted from the display panel.

The polarizing plate may be combined with a compensation film, and thus, function as an antireflective film preventing reflection of externally incident light. The antireflective film may be formed on one side or both sides of a display device, and thus, have an influence on visibility of the display device.

There remains a need for a polarizing film capable of realizing various reflectance colors, which improves visibility of a display device.

SUMMARY

An embodiment provides a color polarizing film capable of realizing various reflectance colors, which improves visibility of a display device.

Another embodiment provides an antireflective film including the color polarizing film.

Yet another embodiment provides a display device including the antireflective film.

According to an embodiment, a color polarizing film includes:

a first layer including a first polymer and a first dichroic dye having an absorption wavelength region of about 380 nanometers to about 780 nanometers, and a second layer including a second polymer and a second dichroic dye having an absorption wavelength region of about 380 nanometers to about 780 nanometers, wherein the second layer is disposed on the first layer, wherein a polarization axis of the first layer and a polarization axis of a second layer cross each other, and wherein the color polarizing film exhibits a maximum absorption wavelength ($\lambda_{max}$) in a wavelength range of about 380 nanometers to about 780 nanometers.

An absorption peak at the maximum absorption wavelength ($\lambda_{max}$) may have a full width at half maximum of less than or equal to about 300 nanometers.

The color polarizing film may realize a color in an off-state of a display device when the color polarizing film is applied to the display device.

The first polymer and the second polymer may be independently selected from a polyolefin, a polyamide, a polyester, a polyacrylate, a polymethacrylate, a styrene-containing polymer, a polycarbonate, a vinyl chloride-based polymer, a polyimide, a polysulfone, a polyethersulfone, a polyether-ether ketone, a polyphenylene sulfide, a polyvinyl alcohol, a polyvinylidene chloride, a polyvinyl butyral, a polyarylate, a polyoxymethylene, an epoxy polymer, a copolymer thereof, and a combination thereof. The first polymer and the second polymer may be independently selected from polyethylene, polypropylene, polyethylene terephthalate, polybutylene terephthalate, glycol modified polyethylene terephthalate, polyethylene naphthalate, nylon, a copolymer thereof, and a combination thereof.

At least one of the first dichroic dye or the second dichroic dye may include one or more dichroic dyes having the same or different absorption wavelength regions.

The first dichroic dye may include at least one of a first dichroic dye (1A) having a maximum absorption wavelength in a wavelength range of about 380 nanometers to about 500 nanometers, a first dichroic dye (1B) having a maximum absorption wavelength in a wavelength range of greater than about 500 nanometers and less than or equal to about 580 nanometers, and a first dichroic dye (1C) having a maximum absorption wavelength in a wavelength range of greater than about 580 nanometers and less than or equal to about 780 nanometers.

The second dichroic dye may include at least one of a second dichroic dye (2A) having a maximum absorption wavelength in a wavelength range of about 380 nanometers to about 500 nanometers, a second dichroic dye (2B) having a maximum absorption wavelength in a wavelength range of greater than about 500 nanometers and less than or equal to about 580 nanometers, and a second dichroic dye (2C) having a maximum absorption wavelength in a wavelength range of greater than about 580 nanometers and less than or equal to about 780 nanometers.

When the first layer includes the first dichroic dye (1A), the first layer may have light transmittance of about 60% to about 85% and the second layer may have light transmittance of greater than or equal to about 30%.

The first dichroic dye (1A) may include at least one of a first dichroic dye (1A-1) having a maximum absorption wavelength in a wavelength range of about 380 nanometers to about 400 nanometers and a first dichroic dye (1A-2) having a maximum absorption wavelength in a wavelength range of greater than about 400 nanometers and less than or equal to about 500 nanometers.

The first dichroic dye (1B) may include at least one of a first dichroic dye (1B-1) having a maximum absorption wavelength in a wavelength range of greater than about 500 nanometers and less than or equal to about 560 nanometers and a first dichroic dye (1B-2) having a maximum absorption wavelength in a wavelength range of greater than about 560 nanometers and less than or equal to about 580 nanometers.

The first dichroic dye (1C) may include at least one of a first dichroic dye (1C-1) having a maximum absorption wavelength in a wavelength range of greater than about 580 nanometers and less than or equal to about 620 nanometers and a first dichroic dye (1C-2) having a maximum absorption wavelength in a wavelength range of greater than about 620 nanometers and less than or equal to about 780 nanometers.

The second dichroic dye (2A) may include at least one of a second dichroic dye (2A-1) having a maximum absorption wavelength in a wavelength range of about 380 nanometers to about 400 nanometers and a second dichroic dye (2A-2) having a maximum absorption wavelength in a wavelength range of greater than about 400 nanometers and less than or equal to about 500 nanometers.

The second dichroic dye (2B) may include at least one of a second dichroic dye (2B-1) having a maximum absorption wavelength in a wavelength range of greater than about 500 nanometers and less than or equal to about 560 nanometers and a second dichroic dye (2B-2) having a maximum absorption wavelength in a wavelength range of greater than about 560 nanometers and less than or equal to about 580 nanometers.

The second dichroic dye (2C) may include at least one of a second dichroic dye (2C-1) having a maximum absorption wavelength in a wavelength range of greater than about 580 nanometers and less than or equal to about 620 nanometers and a second dichroic dye (2C-2) having a maximum absorption wavelength in a wavelength range of greater than about 620 nanometers and less than or equal to about 780 nanometers.

The first dichroic dye and the second dichroic dye may independently include a compound represented by Chemical Formula 1.

Chemical Formula 1

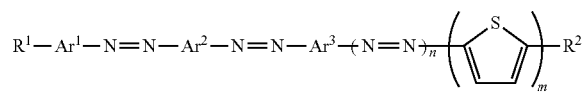

In Chemical Formula 1, $Ar^1$ to $Ar^3$ are independently a substituted or unsubstituted C6 to C15 arylene group, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, $R^2$ is selected from hydrogen, a substituted or unsubstituted C1 to C30 alkyl group, a substituted or unsubstituted C6 to C20 aryl group, a substituted or unsubstituted C3 to C20 heteroaryl group, —$NR^3R^4$, and a combination thereof, wherein $R^3$ and $R^4$ are independently hydrogen, or a substituted or unsubstituted C1 to C10 alkyl group, which are optionally linked to each other to provide a ring, n is 0, 1, or 2, and m is 0 or 1.

The compound represented by Chemical Formula 1 may be at least one of a first dichroic dye (1A) having a maximum absorption wavelength in a wavelength range of about 380 nanometers to about 500 nanometers, a first dichroic dye (1B) having a maximum absorption wavelength in a wavelength range of greater than about 500 nanometers and less than or equal to about 580 nanometers, and a first dichroic dye (1C) having a maximum absorption wavelength in a wavelength range of greater than about 580 nanometers and less than or equal to about 780 nanometers, in accordance with the values of n, m, $R^1$, and $R^2$.

The first dichroic dye (1A) may be the compound wherein in Chemical Formula 1, n is 0 or 1, m is 0, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, or a combination thereof, and $R^2$ is selected from hydrogen, a substituted or unsubstituted C1 to C30 alkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The first dichroic dye (1B) may be the compound wherein in Chemical Formula 1, n is 0 or 1, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and $R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The first dichroic dye (1C) may be the compound wherein in Chemical Formula 1, n is 1 or 2, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, $R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The compound represented by Chemical Formula 1 may be at least one of a second dichroic dye (2A) having a maximum absorption wavelength in a wavelength range of about 380 nanometers to about 500 nanometers, second dichroic dye (2B) having a maximum absorption wavelength in a wavelength range of greater than about 500 nanometers and less than or equal to about 580 nanometers, and a second dichroic dye (2C) having a maximum absorption wavelength in a wavelength range of greater than about 580 nanometers and less than or equal to about 780 nanometers, in accordance with the values of n, m, $R^1$, and $R^2$.

For example, the second dichroic dye (2A) may be the compound wherein in Chemical Formula 1, n is 0 or 1, m is 0, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, or a combination thereof, and $R^2$ is selected from hydrogen, a substituted or unsubstituted C1 to C30 alkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The second dichroic dye (2B) may be the compound wherein in Chemical Formula 1, n is 0 or 1, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, or a combination thereof, and $R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The second dichroic dye (2C) may be the compound wherein in Chemical Formula 1, n is 1 or 2, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, or a combination thereof, and $R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

When the first dichroic dye includes the first dichroic dye (1A) having a maximum absorption wavelength in a wavelength range of about 380 nanometers to about 500 nanometers, the first layer may have light transmittance of about 60% to about 85% and the second layer may have light transmittance of greater than or equal to about 30%. Herein, a ratio ($T_1/T_2$) of the light transmittance ($T_1$) of the first layer relative to the light transmittance ($T_2$) of the second layer may range from about 1.2 to about 2.9.

When the first dichroic dye includes the first dichroic dye (1B) having a maximum absorption wavelength in a wavelength range of greater than about 500 nanometers and less than or equal to about 580 nanometers, and the first dichroic dye (1C) having a maximum absorption wavelength in a wavelength range of greater than about 580 nanometers and less than or equal to about 780 nanometers, and a combination thereof, the first layer may have light transmittance of about 30% to about 50% and the second layer may have light transmittance of greater than or equal to about 60%. Herein, a ratio ($T_1/T_2$) of the light transmittance ($T_1$) of the first layer relative to the light transmittance ($T_2$) of the second layer may range from about 0.3 to about 0.9.

The color polarizing film may have polarization efficiency of about 85% to about 95% and light transmittance of about 35% to about 45%.

The first dichroic dye may be included in an amount of about 0.01 to about 10 parts by weight based on 100 parts by weight of the first polymer and the second dichroic dye may be included in an amount of about 0.01 to about 10 parts by weight based on 100 parts by weight of the second polymer.

The first layer of the color polarizing film may be made of a melt blend of the first polymer and the first dichroic dye and the second layer may be made of a melt blend of the second polymer and the second dichroic dye.

According to another embodiment, an antireflective film includes:

the color polarizing film; and a compensation film.

The compensation film may be a λ/4 plate.

According to another embodiment, a display device includes:

a display panel; and the antireflective film disposed on at least one surface of the display panel.

The display device may include an organic light emitting diode display or a liquid crystal display.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
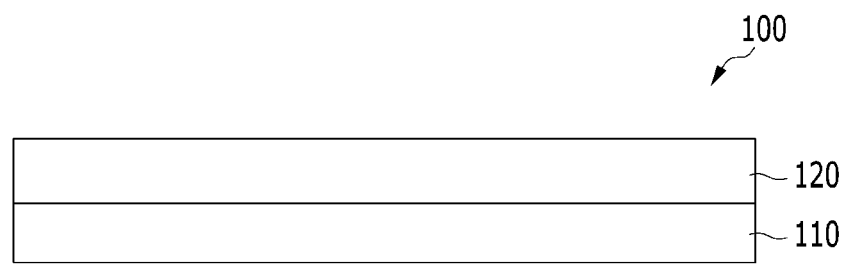
FIG. 1 is a schematic view showing a color polarizing film according to an embodiment.

Exemplary embodiments will hereinafter be described in detail, and may be easily performed by those who have common knowledge in the related art. However, this disclosure may be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Mixture" as used herein is inclusive of all types of combinations, including blends, alloys, solutions, and the like.

As used herein, the term "alkyl group" refers to a straight or branched chain saturated aliphatic hydrocarbon group having the specified number of carbon atoms and having one valence. Non-limiting examples of the alkyl group are methyl, ethyl, and propyl.

As used herein, the term "alkoxy group" refers to "alkyl-O—", wherein the term "alkyl" has the same meaning as described above. Non-limiting examples of the alkoxy group are methoxy, ethoxy, propoxy, cyclopropoxy, and cyclohexyloxy.

As used herein, the term "alkylthio group" refers to "alkyl-S—", wherein the term "alkyl" has the same meaning as described above. Non-limiting examples of the alkylthio group are methylthio, ethylthio, propylthio, cyclopropylthio, and cyclohexylthio.

As used herein, the term "alkenyl group" refers to a straight or branched chain, monovalent hydrocarbon group having at least one carbon-carbon double bond.

As used herein, the term "alkynyl group" refers to a straight or branched chain, monovalent hydrocarbon group having at least one carbon-carbon triple bond.

As used herein, when a definition is not otherwise provided, the term "substituted" refers to replacement of at least one hydrogen of a compound or a group by a halogen (—F, —Br, —Cl, or —I), a C1 to C20 alkoxy group, a cyano group, an amino group, a C1 to C20 ester group, a C1 to C20 alkyl group, a C2 to C20 alkenyl group, a C2 to C20 alkynyl group, a C6 to C20 aryl group, a C2 to C20 heteroaryl group, and a combination thereof.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C30 alkyl" refers to a C1 to C30 alkyl group substituted with C6 to C30 aryl group, the total number of carbon atoms in the resulting aryl substituted alkyl group is C7 to C60.

As used herein, when a definition is not otherwise provided, the term "hetero" refers to a functional group including 1 to 3 heteroatoms selected from N, O, S, P, and Si.

Hereinafter, referring to FIG. 1, a color polarizing film according to an embodiment is described.

FIG. 1 is a schematic view showing a color polarizing film according to an embodiment.

Referring to FIG. 1, a color polarizing film 100 according to an embodiment includes a first layer 110 including a first polymer and a first dichroic dye having an absorption wavelength region of about 380 nanometers (nm) to about 780 nm; and a second layer 120 including a second polymer and a second dichroic dye having an absorption wavelength region of about 380 nm to about 780 nm, wherein the second layer 120 is disposed on the first layer 110, wherein a polarization axis of the first layer 110 and a polarization axis of a second layer 120 cross each other, and wherein the color polarizing film exhibits a maximum absorption wavelength ($\lambda_{max}$) in a wavelength range of about 380 nm to about 780 nm.

The maximum absorption wavelength ($\lambda_{max}$) is determined when the peak is found as evidence of a full width at half maximum (FWHM) and the peak may be identified at a predetermined wavelength in the absorption graph according to the wavelength of the color polarizing film 100. In an embodiment, the full width at half maximum (FWHM) of the absorption peak at the maximum absorption wavelength ($\lambda_{max}$) may be less than or equal to about 300 nm, for example about 100 nm to about 250 nm or about 100 nm to about 200 nm. While not wishing to be bound by theory, it is understood that within the ranges, the color polarizing film 100 may realize a desirable color.

When the first layer 110 and the second layer 120 are combined so that their polarization axes cross each other, various colors may be realized as desired.

The color polarizing film 100 exhibits a maximum absorption wavelength ($\lambda_{max}$) in a wavelength range of about 380 nm to about 780 nm, and thus, realizes a color even in an off-state of a display device when the color polarizing film is applied to the display device.

The first polymer and the second polymer may independently be a hydrophobic polymer, for example, a polyolefin such as polyethylene (PE), polypropylene (PP), and a copolymer thereof; a polyamide such as nylon and an aromatic polyamide; a polyester such as polyethylene terephthalate (PET), polybutylene terephthalate (PBT), glycol modified polyethylene terephthalate (PETG), and polyethylene naphthalate (PEN); a poly(meth)acrylate polymer such as polymethyl(meth)acrylate; a styrene-containing polymer such as polystyrene (PS) and a (meth)acrylonitrile-styrene copolymer; a polycarbonate; a vinyl chloride-based polymer; a polyimide; a polysulfone; a polyethersulfone; a polyetherether ketone; a polyphenylene sulfide; a polyvinyl alcohol; a polyvinylidene chloride; a polyvinyl butyral; a polyarylate; a polyoxymethylene; an epoxy polymer; a copolymer thereof; or a combination thereof. In an embodiment, the first polymer and the second polymer may be, for example, polyethylene (PE), polypropylene (PP), polyethylene terephthalate (PET), polybutylene terephthalate (PBT), glycol modified polyethylene terephthalate (PETG), polyethylene naphthalate (PEN), nylon, a copolymer thereof, or a combination thereof.

In another embodiment, the first polymer and the second polymer may be, for example, a mixture of two or more selected from polyethylene (PE), polypropylene (PP), and a copolymer of polyethylene and polypropylene (PE-PP), and for another example, a mixture of polypropylene (PP) and a polyethylene-polypropylene (PE-PP) copolymer.

The polypropylene (PP) may have, for example, a melt flow index (MFI measured according to ASTM D1238) of about 0.1 g/10 min (0.1 grams per 10 minutes) to about 5 g/10 min. Herein, the melt flow index (MFI) shows the amount of a polymer in a molten state flowing per 10 min, and relates to viscosity of the polymer in a molten state. In other words, as the melt flow index (MFI) becomes lower, the polymer has higher viscosity, while as the melt flow index (MFI) becomes higher, the polymer has lower viscosity. While not wishing to be bound by theory, it is understood that when the polypropylene has a melt flow index (MFI) within the range, workability may be effectively improved and properties of a final product may also be effectively improved. For example, the polypropylene may have a melt flow index (MFI) ranging from about 0.5 g/10 min to about 5 g/10 min.

The polyethylene-polypropylene copolymer (PE-PP) may include about 1 percent by weight (wt %) to about 50 wt % of an ethylene group based on the total amount of the copolymer. While not wishing to be bound by theory, it is understood that when the polyethylene-polypropylene (PE-PP) copolymer includes the ethylene group within the range, phase-separation of the polypropylene and the polyethylene-polypropylene (PE-PP) copolymer may be prevented or reduced. In addition, while excellent light transmittance and alignment properties are maintained, the elongation is enhanced when the film is elongated, so the polarization characteristics of the film may be improved. For example, the polyethylene-polypropylene (PE-PP) copolymer may include about 1 wt % to about 25 wt % of the ethylene group based on the total amount of the copolymer.

The polyethylene-polypropylene (PE-PP) copolymer may have, for example, a melt flow index (MFI) of about 5 g/10 min to about 15 g/10 min. While not wishing to be bound by theory, it is understood that when the polyethylene-polypropylene (PE-PP) copolymer has a melt flow index (MFI) within the range, workability may be effectively improved and properties of a final product may also be effectively improved. For example, the polyethylene-polypropylene (PE-PP) copolymer may have a melt flow index (MFI) of about 10 g/10 min to about 15 g/10 min.

The first polymer and the second polymer may independently include the polypropylene (PP) and the polyethylene-polypropylene (PE-PP) copolymer in a weight ratio of about 1:9 to about 9:1. While not wishing to be bound by theory, it is understood that when the polypropylene (PP) and the polyethylene-polypropylene (PE-PP) copolymer are included within the range, crystallization of polypropylene may be prevented, and thus, haze characteristics may be improved while excellent mechanical strength is maintained. For example, first polymer and the second polymer may independently include the polypropylene (PP) and the polyethylene-polypropylene (PE-PP) copolymer in a weight ratio of about 4:6 to about 6:4, or about 5:5.

The first polymer and the second polymer may independently have a melt flow index (MFI) of about 1 g/10 min to about 15 g/10 min. While not wishing to be bound by theory, it is understood that when the first polymer and the second polymer have a melt flow index (MFI) within the range, excessive crystals are not formed in the polymer 11 resin, and thus, excellent light transmittance may be ensured and simultaneously workability may be effectively improved due to an appropriate viscosity for manufacturing a film. For example, the first polymer and the second polymer may have a melt flow index (MFI) of about 5 g/10 min to about 15 g/10 min.

The first polymer and the second polymer may have crystallinity of about 50% or less. While not wishing to be bound by theory, it is understood that when the first polymer and the second polymer have crystallinity within the range, haze may be lowered, and thus, excellent optical properties may be realized. For example, the first polymer and the second polymer may have crystallinity of about 30% to about 50%.

The first polymer and the second polymer may have light transmittance of greater than or equal to about 85% in a wavelength region of about 380 nm to about 780 nm. The first polymer and the second polymer may be elongated in a uniaxial direction. The uniaxial direction of the first polymer and the second polymer may be the same as a length direction of the dichroic dye 12.

The first dichroic dye is dispersed in the first polymer, and is arranged in one direction along an elongation direction of the first polymer and the second dichroic dye is dispersed in the second polymer. The first dichroic dye and the second dichroic dye may transmit one perpendicular polarizing component out of two perpendicular polarizing components in a predetermined wavelength region.

At least one of the first dichroic dye or the second dichroic dye may independently include one or more dichroic dyes having the same or different absorption wavelength regions.

The first dichroic dye may include at least one, for example one or more of a first dichroic dye (1A) having a maximum absorption wavelength in a wavelength range of about 380 nm to about 500 nm, a second dichroic dye (1B) having a maximum absorption wavelength in a wavelength range of greater than about 500 nm and less than or equal to about 580 nm, and a third dichroic dye (1C) having a maximum absorption wavelength in a wavelength range of greater than about 580 nm and less than or equal to about 780 nm.

The second dichroic dye may include may include at least one, for example one or more of a second dichroic dye (2A) having a maximum absorption wavelength in a wavelength range of about 380 nm to about 500 nm, a second dichroic dye (2B) having a maximum absorption wavelength in a wavelength range of greater than about 500 nm and less than or equal to about 580 nm and a second dichroic dye (2C) having a maximum absorption wavelength in a wavelength range of greater than about 580 nm and less than or equal to about 780 nm.

Herein, the first layer 110 of the color polarizing film 100 may not include all three varieties of the first dichroic dye (1A), the first dichroic dye (1B), and the first dichroic dye (1C) in order to realize a desirable color. In the case of including all three varieties of the first dichroic dye (1A), the first dichroic dye (1B), and the first dichroic dye (1C), a neutral gray film may be obtained. Accordingly, in order to provide a variety of colors, the first layer 110 may not include all three varieties of the first dichroic dye (1A), the first dichroic dye (1B), and the first dichroic dye (1C). The first dichroic dye (1A), the first dichroic dye (1B), and the first dichroic dye (1C) may be a yellow dye, a magenta dye, and a cyan dye, respectively, but are not limited thereto.

Herein, the second layer 120 of the color polarizing film 100 may not include all three varieties of the second dichroic dye (2A), the second dichroic dye (2B), and the second dichroic dye (2C) in order to realize a desirable color. When all three varieties of the second dichroic dye (2A) the second dichroic dye (2B), and the second dichroic dye (2C) are included, a neutral gray film may be obtained. Accordingly, in order to provide various colors, the second layer 120 may not include all three varieties of the second dichroic dye (2A), the second dichroic dye (2B), and the second dichroic dye (2C). The second dichroic dye (2A), the second dichroic dye (2B), and the second dichroic dye (2C) may be a yellow dye, a magenta dye, and a cyan dye, respectively, but are not limited thereto.

In exemplary embodiments, the first layer 110 may include the first dichroic dye selected from the first dichroic dye (1A), the first dichroic dye (1B) and a combination thereof, and the second layer may include the second dichroic dye selected from the second dichroic dye (2A), the second dichroic dye (2B), and a combination thereof.

In exemplary embodiments, the first layer 110 may include the first dichroic dye selected from the first dichroic dye (1B), the first dichroic dye (1C), and a combination thereof, and the second layer 120 may include the second dichroic dye selected from the second dichroic dye (2B), the second dichroic dye (2C), and a combination thereof.

In exemplary embodiments, the first layer 110 may include the first dichroic dye (1B), and the second layer 120 may include the second dichroic dye (2A). In addition, the first layer 110 may include the first dichroic dye (1A), and the second layer 120 may include the second dichroic dye (2B).

The first dichroic dye (1A) may include at least one of a first dichroic dye (1A-1) having a maximum absorption wavelength in a wavelength range of about 380 nm to about 400 nm and a first dichroic dye (1A-2) having a maximum absorption wavelength in a wavelength range of greater than about 400 nm and less than or equal to about 500 nm.

The first dichroic dye (1B) may include at least one of a first dichroic dye (1B-1) having a maximum absorption wavelength in a wavelength range of greater than about 500 nm and less than or equal to about 560 nm and a first dichroic dye (1B-2) having a maximum absorption wavelength in a wavelength range of greater than about 560 nm and less than or equal to about 580 nm.

The first dichroic dye (1C) may include at least one of a first dichroic dye (1C-1) having a maximum absorption wavelength in a wavelength range of greater than about 580 nm and less than or equal to about 620 nm and a first dichroic dye (1C-2) having a maximum absorption wavelength in a wavelength range of greater than about 620 nm and less than or equal to about 780 nm.

The second dichroic dye (2A) may include at least one of a second dichroic dye (2A-1) having a maximum absorption wavelength in a wavelength range of about 380 nm to about 400 nm and a second dichroic dye (2A-2) having a maximum absorption wavelength in a wavelength range of greater than about 400 nm and less than or equal to about 500 nm.

The second dichroic dye (2B) may include at least one of a second dichroic dye (2B-1) having a maximum absorption wavelength in a wavelength range of greater than about 500 nm and less than or equal to about 560 nm and a second dichroic dye (2B-2) having a maximum absorption wavelength in a wavelength range of greater than about 560 nm and less than or equal to about 580 nm.

The second dichroic dye (2C) may include at least one of a second dichroic dye (2C-1) having a maximum absorption wavelength in a wavelength range of greater than about 580 nm and less than or equal to about 620 nm and a second dichroic dye (2C-2) having a maximum absorption wavelength in a wavelength range of greater than about 620 nm and less than or equal to about 780 nm.

The first dichroic dye and the second dichroic dye may be, for example, an azo group-containing compound, for example an azo group-containing compound represented by Chemical Formula 1.

Chemical Formula 1

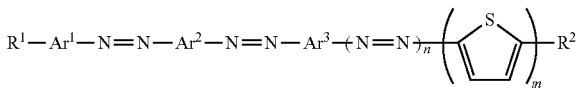

In Chemical Formula 1, $Ar^1$ to $Ar^3$ are independently a substituted or unsubstituted C6 to C15 arylene group, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C30 alkenyl group, a substituted or unsubstituted C2 to C30 alkynyl group, and a combination thereof, $R^2$ is selected from hydrogen, a substituted or unsubstituted C1 to C30 alkyl group, a substituted or unsubstituted C6 to C20 aryl group, a substituted or unsubstituted C3 to C20 heteroaryl group, —$NR^3R^4$, and a combination thereof, wherein $R^3$ and $R^4$ are independently hydrogen, or a substituted or unsubstituted C1 to C10 alkyl group, which are optionally linked to each other to provide a ring, n is 0, 1, or 2, and m is 0 or 1.

In Chemical Formula 1, $Ar^1$ to $Ar^3$ may include, for example, a substituted or unsubstituted phenylene group, a substituted or unsubstituted naphthalene group, or a substituted or unsubstituted biphenylene group. Herein, the substituted phenylene group, the substituted naphthalene group, and the substituted biphenylene group may be, for example, a phenylene group, a naphthalene group, and a biphenylene group substituted with a C1 to C20 alkyl group, a C1 to C20 alkoxy group, a halogen, a halogen-containing group, or a combination thereof.

For example, at least one of $Ar^1$ to $Ar^3$ may be a substituted phenylene group, a substituted naphthalene group, or a substituted biphenylene group, and for example at least one of $Ar^1$ to $Ar^3$ may be a phenylene group, a naphthalene group, or a biphenylene group substituted with a C1 to C20 alkyl group, a C1 to C20 alkoxy group, a halogen, a halogen-containing group, or a combination thereof.

For example, at least two of $Ar^1$ to $Ar^3$ may be a substituted phenylene group, a substituted naphthalene group, or a substituted biphenylene group, and for example at least two of $Ar^1$ to $Ar^3$ may be a phenylene group, a naphthalene group, or a biphenylene group substituted with a C1 to C20 alkyl group, a C1 to C20 alkoxy group, a halogen, a halogen-containing group, or a combination thereof.

The compound represented by Chemical Formula 1 may be, for example at least one of a first dichroic dye (1A) having a maximum absorption wavelength in a wavelength range of about 380 nm to about 500 nm, a second dichroic dye (1B) having a maximum absorption wavelength in a wavelength range of greater than about 500 nm and less than or equal to about 580 nm, and a third dichroic dye (1C) having a maximum absorption wavelength in a wavelength range of greater than about 580 nm and less than or equal to about 780 nm, in accordance with the values of n, m, $R^1$, and $R^2$.

For example, the first dichroic dye (1A) may be the compound wherein in Chemical Formula 1, n is 0 or 1, m is 0, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and $R^2$ is selected from hydrogen, a substituted or unsubstituted C1 to C30 alkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The first dichroic dye (1B) may be the compound wherein in Chemical Formula 1, n is 0 or 1, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and $R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The first dichroic dye (1C) may be the compound wherein in Chemical Formula 1, n is 1 or 2, m is 1, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and $R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The compound represented by Chemical Formula 1 may be, for example at least one of a second dichroic dye (2A) having a maximum absorption wavelength in a wavelength range of about 380 nm to about 500 nm, a second dichroic dye (2B) having a maximum absorption wavelength in a wavelength range of greater than about 500 nm and less than or equal to about 580 nm, and a second dichroic dye (2C) having a maximum absorption wavelength in a wavelength range of greater than about 580 nm and less than or equal to about 780 nm, in accordance with the values of n, m, $R^1$, and $R^2$.

For example, the second dichroic dye (2A) may be the compound wherein in Chemical Formula 1, n is 0 or 1, m is 0, $R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and $R^2$ is selected from hydrogen, a substituted or unsubstituted C1 to C30 alkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

The second dichroic dye (2B) may be the compound wherein in Chemical Formula 1, n is 0 or 1, m is 1, R¹ is selected from a substituted or unsubstituted C1 to C30 alkyl group, a substituted or unsubstituted C1 to C20 alkoxy group, a substituted or unsubstituted C1 to C20 alkylthio group, —(C═O)R (wherein R is a substituted or unsubstituted C1 to C30 alkyl group), —O(C═O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and R² is selected from hydrogen, a substituted or unsubstituted C1 to C30 alkyl group, a substituted or unsubstituted C6 to C20 aryl group, —NR³R⁴, and a combination thereof, wherein R³ and R⁴ are independently hydrogen, or a substituted or unsubstituted C1 to C10 alkyl group, which are optionally linked to each other to provide a ring.

The second dichroic dye (2C) may be the compound wherein in Chemical Formula 1, n is 1 or 2, m is 1, R¹ is selected from a substituted or unsubstituted C1 to C30 alkyl group, a substituted or unsubstituted C1 to C20 alkoxy group, a substituted or unsubstituted C1 to C20 alkylthio group, —(C═O)R (wherein R is a substituted or unsubstituted C1 to C30 alkyl group), —O(C═O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and R² is selected from hydrogen, a substituted or unsubstituted C1 to C30 alkyl group, a substituted or unsubstituted C6 to C20 aryl group, —NR³R⁴, and a combination thereof, wherein R³ and R⁴ are independently hydrogen, or a substituted or unsubstituted C1 to C10 alkyl group, which are optionally linked to each other to provide a ring.

When the first layer 110 includes the first dichroic dye (1A), the first layer 110 may have light transmittance of about 60% to about 85%, for example about 65% to about 85% and the second layer 120 may have light transmittance of greater than or equal to about 30%, for example about 35% to about 50%. Herein, a ratio ($T_1/T_2$) of the light transmittance ($T_1$) of the first layer 110 relative to the light transmittance ($T_2$) of the second layer 120 may range from about 1.2 to about 2.9, for example about 1.3 to about 2.9, or about 1.3 to about 2.5. While not wishing to be bound by theory, it is understood that within the ranges, reflectance of the color polarizing film 100 may be lowered and light transmittance may be improved and a desirable color may be realized.

When the first layer 110 includes the first dichroic dye (1B) or the first dichroic dye (1C), the first layer 110 may have light transmittance of about 30% to about 50%, for example about 40% to about 50% and the second layer 120 may have light transmittance of about greater than or equal to about 60%, for example about 65% to about 75%. Herein, a ratio ($T_1/T_2$) of the light transmittance ($T_1$) of the first layer 110 relative to the light transmittance ($T_2$) of the second layer 120 may range from about 0.3 to about 0.9, for example about 0.35 to about 0.85 or about 0.4 to about 0.8. While not wishing to be bound by theory, it is understood that within the ranges, reflectance of the color polarizing film 100 may be lowered and light transmittance may be improved and a desirable color may be realized.

The color polarizing film 100 may have polarization efficiency of about 85% to about 95%, for example about 89% to about 93% and light transmittance of about 35% to about 45%, for example about 36% to about 44%. As the polarization efficiency and the light transmittance are within the ranges, the light emission in the display device may not be interrupted when the color polarizing film 100 is applied on one surface of the display device.

The first dichroic dye may be included in an amount of about 0.01 to about 10 parts by weight, for example about 0.05 to about 5 parts by weight based on 100 parts by weight of the first polymer and the second dichroic dye may be included in an amount of about 0.01 to about 10 parts by weight, for example about 0.05 to about 5 parts by weight based on 100 parts by weight of the second polymer. While not wishing to be bound by theory, it is understood that within the ranges, sufficient polarization characteristics and color characteristics may be accomplished while not deteriorating the light transmittance of the light polarizing film 100.

The color polarizing film 100 may have a dichroic ratio of about 2 to about 14 at a wavelength of about 450 nm to about 550 nm, The color polarizing film 100 may have a dichroic ratio of about 2 to about 14 at a wavelength of about 380 nm to about 650 nm.

Herein, the dichroic ratio is a value obtained by dividing linear polarization absorption in a direction perpendicular to the axis of the polymer by polarization absorption in a direction parallel to the polymer, and may be obtained by Equation 1.

$$DR=\mathrm{Log}(1/T_\perp)/\mathrm{Log}(1/T_{//})\quad\quad\text{Equation 1}$$

In Equation 1,

DR is a dichroic ratio of a polarizing film, $T_{\|}$ is light transmittance of light entering parallel to the transmissive axis of a polarizing film, and $T_\perp$ is light transmittance of light entering perpendicular to the transmissive axis of a polarizing film.

The dichroic ratio denotes a degree to which the first dichroic dye and the second dichroic dye are aligned in one direction in the color polarizing film 100. The color polarizing film 100 has a dichroic ratio within the ranges in a predetermined wavelength range, which leads the first dichroic dye and the second dichroic dye to be aligned along the alignment of a polymer chain. As a result, the polarizing characteristics of the film may be improved, while the reflection may be decreased to about 10% or less.

The color polarizing film 100 may have a low thickness of less than or equal to about 40 micrometers (μm), for example, a thickness of about 30 μm to about 40 μm. The first layer 110 of the color polarizing film 100 may have a thickness of less than or equal to about 30 μm, for example, a thickness ranging from about 15 μm to about 20 μm. The second layer 120 of the color polarizing film 100 may have a thickness of less than or equal to about 30 μm, for example, a thickness ranging from about 15 μm to about 20 μm. While not wishing to be bound by theory, it is understood that when the first and second layers respectively have a thickness within the ranges, the color polarizing film 100 may be thinner than a polarizer requiring a protective layer such as triacetyl cellulose (TAC), and as a result, a thin display device may be realized.

The first layer 110 of the color polarizing film 100 may be formed of a melt blend of a first polymer and a first dichroic dye, wherein the melt blend may be obtained by mixing the first polymer and the first dichroic dye at a temperature higher than or equal to the melting point of the first polymer. The second layer 120 of the color polarizing film 100 may be formed of a melt blend of a second polymer and a second dichroic dye, wherein the melt blend may be obtained by mixing the second polymer and the second dichroic dye at a temperature higher than or equal to the melting point of the first polymer. The melt-blending may be for example performed at a temperature of less than or equal to about 300° C., for example, at a temperature ranging from about 50 to about 300° C.

In an embodiment, the color polarizing film 100 is manufactured by melt-blending the first polymer and the first dichroic dye to form a sheet, elongating the sheet in a uniaxial direction to form the first layer 110, melt-blending the second polymer and the second dichroic dye to form another sheet, elongating the sheet in a uniaxial direction to obtain the second layer 120, and then, bonding the first and second layers with their polarization axes cross each other. The first and second layers 110 and 120 may be bonded by an adhesion layer. The adhesion layer may be used to effectively bond the first and second layers 110 and 120, and for example, may be made of a pressure sensitive adhesive.

The elongation in a uniaxial direction may be performed at a temperature ranging from about 30° C. to about 200° C. at an elongation ratio of about 300% to about 1,500%. Herein, the elongation ratio is a ratio of a length after elongation relative to a length before the elongation, which indicates a degree that the sheets are elongated in a uniaxial direction.

Figure 2:
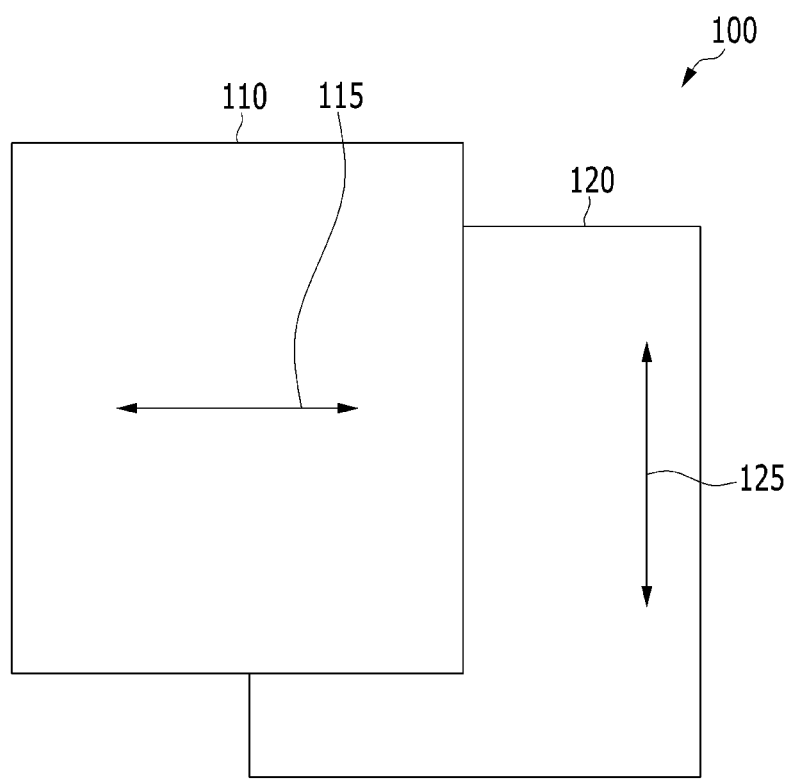
FIG. 2 is a schematic top plan view of polarization axes of the color polarizing film of FIG. 1.

FIG. 2 is a schematic top plan view showing the polarization axes of the color polarizing film 100 of FIG. 1.

Referring to FIG. 2, the polarization axis 115 of the first layer 110 has an angle of about 85° to about 95°, for example, about 87.5° to about 92.5°, for example about 90° with the polarization axis 125 of the second layer.

Figure 3:
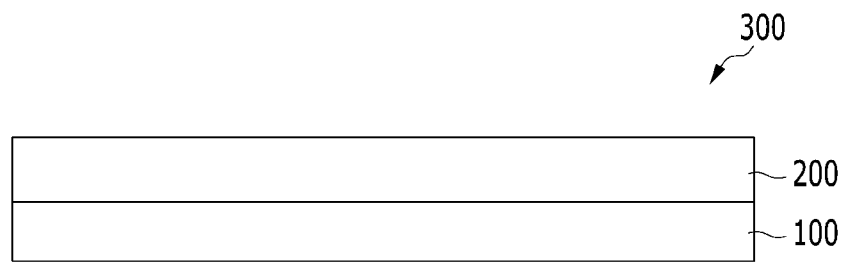
FIG. 3 is a schematic view showing an antireflective film according to an embodiment.

FIG. 3 is a schematic view showing an antireflective film according to an embodiment. Referring to FIG. 3, an antireflective film 300 according to an embodiment includes a compensation film 200 and a color polarizing film 100 on one surface of the compensation film 200. The compensation film 200 may be a retardation film, for example a λ/4 plate. The compensation film 200 may circularly-polarize light passed through the color polarizing film 100 to generate retardation, and may influence reflection and/or absorption of light.

The antireflective film 300 may be mounted on one or both surfaces of a display device, and particularly, may prevent light flowing into the display part of the display device from the outside from being reflected (hereinafter referred to as "external light reflection"). Accordingly, the antireflective film 300 may prevent visibility deterioration caused by the external light reflection.

Figure 4:
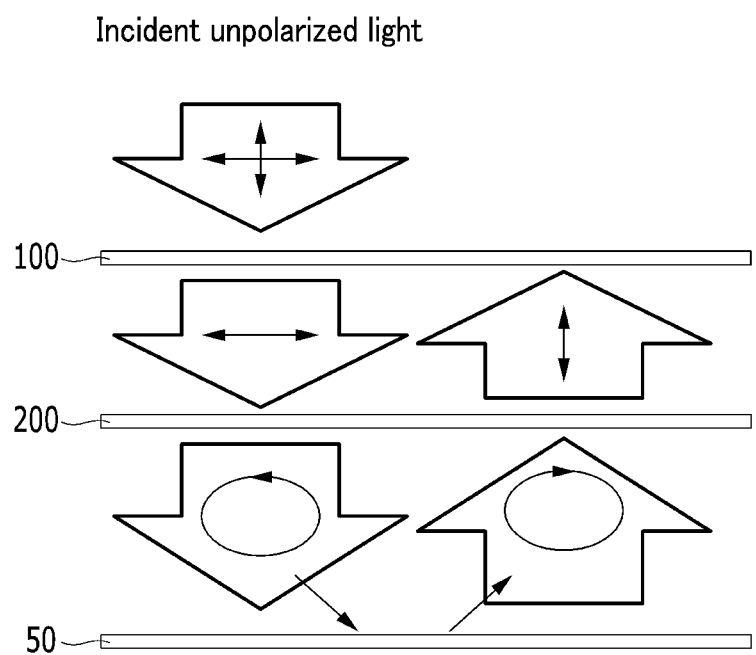
FIG. 4 is a schematic view showing the anti-reflection principle of a color polarizing film.

FIG. 4 is a schematic view showing the anti-reflection principle of a color polarizing film.

Referring to FIG. 4, the incident non-polarized light having entered from the outside is passed through the color polarizing film 100, and the polarized light is shifted into circularly polarized light by passing through the compensation film 200, for example a λ/4 plate. While the circularly polarized light is reflected in a display panel 50 including a substrate, an electrode, and optionally, other layers, and when the circular polarization direction is changed and the circularly polarized light is passed through the compensation film 200 again, only a second polarized perpendicular component, which is the other polarized perpendicular component of the two polarized perpendicular components, may be transmitted. As the second polarized perpendicular component is not passed through the color polarizing film 100, and light does not exit to the outside, effects of preventing the external light reflection may be provided.

The antireflective film 300 may be applied to various display devices.

The display device may be, for example, an organic light emitting diode (OLED) display or a liquid crystal display (LCD), but is not limited thereto.

A display device according to an embodiment includes a display panel and the antireflective film on at least one surface of the display panel.

The display panel may include, for example, two substrates facing each other with an active layer disposed therebetween, and for example, may include a liquid crystal panel or an organic light emitting panel.

As described above, the antireflective film includes the compensation film and the color polarizing film, wherein the compensation film may be a phase difference film such as a λ/4 plate as described above, and wherein the color polarizing film includes the first layer 110 including a first polymer and a first dichroic dye having an absorption wavelength region of about 380 nm to about 780 nm; and the second layer 120 including a second polymer and a second dichroic dye having an absorption wavelength region of about 380 nm to about 780 nm, wherein the second layer 120 is disposed on the first layer 110, wherein the polarization axis of the first layer 110 and the polarization axis of the second layer 120 cross each other, and wherein the color polarizing film exhibits a maximum absorption wavelength ($\lambda_{max}$) in a range of about 380 nm to about 780 nm. Specific details are the same as described above.

Hereinafter, an organic light emitting diode (OLED) display as one example of the display device is described.

Figure 5:
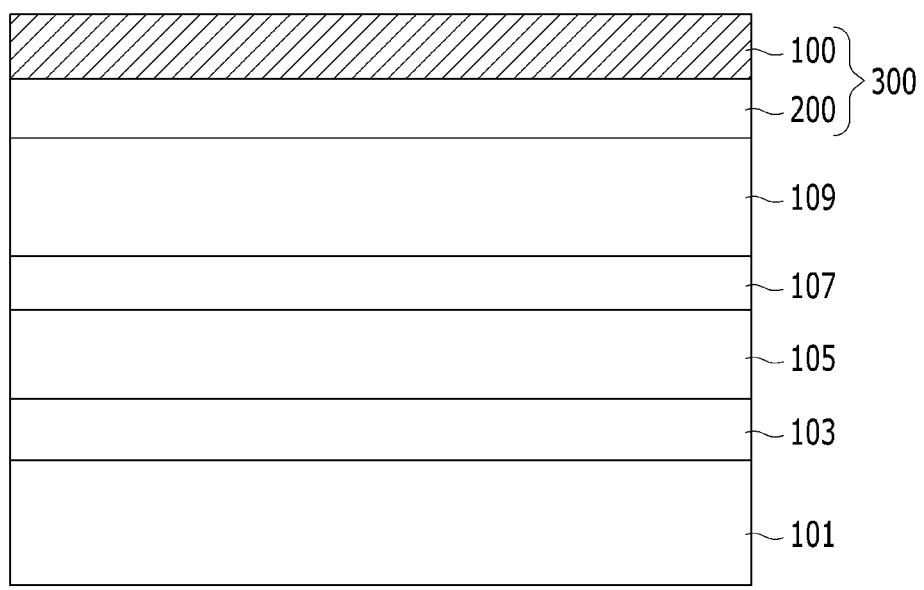
FIG. 5 is a cross-sectional view schematically showing an organic light emitting diode (OLED) display according to an embodiment.

FIG. 5 is a cross-sectional view schematically showing an organic light emitting diode (OLED) display according to an embodiment.

Referring to FIG. 5, an organic light emitting diode (OLED) display 1 according to an embodiment includes a base substrate 101, a lower electrode 103 disposed on the base substrate 101, an organic emission layer 105 disposed on the lower electrode 103, an upper electrode 107 disposed on the organic emission layer 105, an encapsulation substrate 109 disposed on the upper electrode 107, and an antireflective film 300 disposed on the encapsulation substrate 109. The antireflective film 300 includes the compensation film 200 and the color polarizing film 100 as described above.

The base substrate 101 may be made of a silicon wafer, glass, plastic, and the like.

Either of the lower electrode 103 or the upper electrode 107 may be an anode, while the other one of them is a cathode. The anode is an electrode where holes are injected, and is formed of a transparent conductive material having a high work function and externally transmitting entered light, for example, ITO or IZO. The cathode is an electrode where electrons are injected. It is formed of a conducting material having a low work function and having no influence on an organic material, and is selected from, for example, aluminum (Al), calcium (Ca), and barium (Ba).

The organic emission layer 105 includes an organic material emitting light when a voltage is applied between the lower electrode 103 and the upper electrode 107.

An auxiliary layer (not shown) may be further included between the lower electrode 103 and the organic emission layer 105 and between the upper electrode 107 and the organic emission layer 105. The auxiliary layer may include a hole transport layer, a hole injection layer, an electron injection layer, and an electron transport layer for balancing electrons and holes.

The encapsulation substrate 109 may be made of glass, metal, or a polymer. The lower electrode 103, the organic emission layer 105, and the upper electrode 107 are sealed to prevent permeating moisture and/or oxygen.

The antireflective film 300 may be disposed at a light-emitting side. For example, the antireflective film 300 may be disposed outside of the base substrate 101 in a bottom emission type in which light emits from the base substrate 101, outside of the encapsulation substrate 109 in a top emission type in which light emits from the encapsulation substrate 109, and outside both of the base substrate 101 and the encapsulation substrate 109 in a both-side emission type in which light emits from the base substrate 101 and the encapsulation substrate 109.

The antireflective film 300 includes the compensation film 200 and the color polarizing film 100 as described above. The color polarizing film 100 can be replaced by the color polarizing film 10 as described above.

Hereinafter, the present disclosure is illustrated in more detail with reference to examples. However, these examples are exemplary, and the present disclosure is not limited thereto.

EXAMPLES

Example 1

Manufacture of Color Polarizing Film

A first composition is prepared by mixing 0.5 parts by weight of a dichroic dye (magenta, $\lambda_{max}$=565 nm) represented by Chemical Formula 1-1 with 100 parts by weight of a polymer including polypropylene (PP, HF351 Samsung Total Petrochemicals Co., Ltd.)) and a polypropylene-polyethylene copolymer (PP-PE, RP5050, Polymirae Co., Ltd.) in a ratio of 50:50 (weight to weight, w/w). A second composition is prepared by mixing 0.5 parts by weight of a dichroic dye (yellow, $\lambda_{max}$=385 nm) represented by Chemical Formula 1-2 with 100 parts by weight of a polymer including polypropylene (PP) and a polypropylene-polyethylene copolymer (PP-PE) in a ratio of 50:50 (w/w).

The first composition is melt-blended at about 230° C. by using a Micro-compounder manufactured by DSM. The melt blend is positioned in a sheet-shaped mold and pressed with a press under a high pressure at a high temperature to provide a sheet. Subsequently, the sheet is elongated in a uniaxial direction (using a tension tester manufactured by Instron) at a ratio of 1,100% at 115° C. to provide a first layer.

The second composition is melt-blended at about 230° C. by using a Micro-compounder manufactured by DSM. The melt blend is placed in a sheet-shaped mold and pressed at a high temperature under a high pressure to provide a sheet. Subsequently, the sheet is elongated at a ratio of 1,100% in a uniaxial direction (using a tension tester manufactured by Instron) at 115° C. to form a second layer.

When light transmittance and $\lambda_{max}$ of the first and second layers are measured by an UV-VIS spectrophotometer (V-7100, JASCO Inc.), the light transmittance ($T_1$) of the first layer is 44.3%, and the $\lambda_{max}$ of the first layer is 565 nm, while the light transmittance ($T_2$) of the second layer is 67.5%, and the $\lambda_{max}$ of the second layer is 385 nm.

The polarization axis of the first layer and the polarization axis of the second layer are disposed to cross each other at 90°, and the first and second layers are adhered by using a pressure sensitive adhesive (PL8540, Saiden Chemical Industry Co., Ltd.) to manufacture a color polarizing film.

Example 2

Manufacture of Color Polarizing Film

A color polarizing film is manufactured according to the same method as Example 1 except for forming the first layer to have light transmittance (T1) of 46.3% and the $\lambda_{max}$ of 565 nm when measured by using a UV-VIS spectrophotometer (V-7100, JASCO Inc.).

Example 3

Manufacture of Color Polarizing Film

A color polarizing film is manufactured according to the same method as Example 1 except for forming the first layer to have light transmittance (T1) of 44.1% and the $\lambda_{max}$ of 565 nm when measured by using a UV-VIS spectrophotometer (V-7100, JASCO Inc.).

Comparative Example 1

Manufacture of Polarizing Film

A composition for a polarizing film is prepared by mixing 100 parts by weight of a polymer including polypropylene (PP, HF351 Samsung Total Petrochemicals Co., Ltd.)) and a

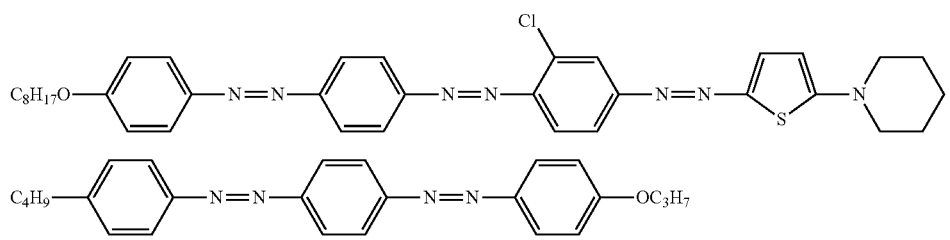

Chemical Formula 1-1

Chemical Formula 1-2 polypropylene-polyethylene copolymer (PP-PE, RP5050, Polymirae Co., Ltd.) in a ratio of 50:50 (w/w) with 1 part by weight of a mixture of dichroic dyes represented by Chemical Formulae 1A to 1D. Each dichroic dye is used in the following amount: 0.200 parts by weight of a dichroic dye represented by Chemical Formula 1A (yellow, $\lambda_{max}$=385 nm), 0.228 parts by weight of a dichroic dye represented by Chemical Formula 1B (yellow, $\lambda_{max}$=455 nm), 0.286 parts by weight of a dichroic dye represented by Chemical Formula 1C (magenta, $\lambda_{max}$=565 nm), and 0.286 parts by weight of a dichroic dye represented by Chemical Formula 1D (cyan, $\lambda_{max}$=600 nm)).

The composition for a polarizing film is melt-blended at about 230° C. by using a Micro-compounder manufactured by DSM. The melt blend is positioned in a sheet-shaped mold and pressed by a press under a high pressure at a high temperature to provide a sheet. Subsequently, the sheet is elongated in a uniaxial direction at a ratio of 1,100% (using a tension tester manufactured by Instron) at 115° C. to provide a polarizing film.

TABLE 1

| | $\lambda_{max}$ | Full width at half maximum (FWHM) | $T_1/T_2$ | Polarization efficiency (PE, %) |
|---|---|---|---|---|
| Example 1 | 405 nm | 120 nm | 0.653 | 94.9 |
| Example 2 | 405 nm | 120 nm | 0.656 | 93.6 |
| Example 3 | 405 nm | 150 nm | 0.686 | 90.8 |

Referring to Table 1, the polarizing films according to Examples 1 to 3 show a maximum absorption wavelength at

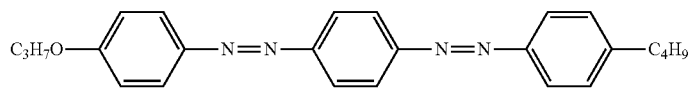

Chemical Formula 1A

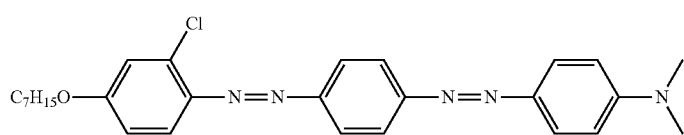

Chemical Formula 1B

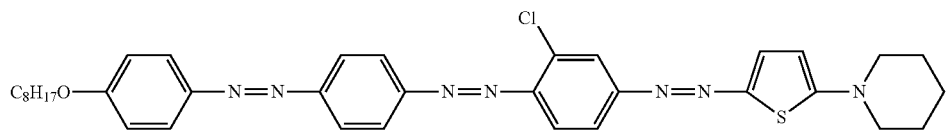

Chemical Formula 1C

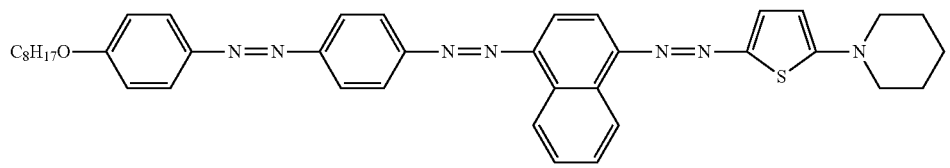

Chemical Formula 1D

Optical Properties of Polarizing Film

Figure 6:
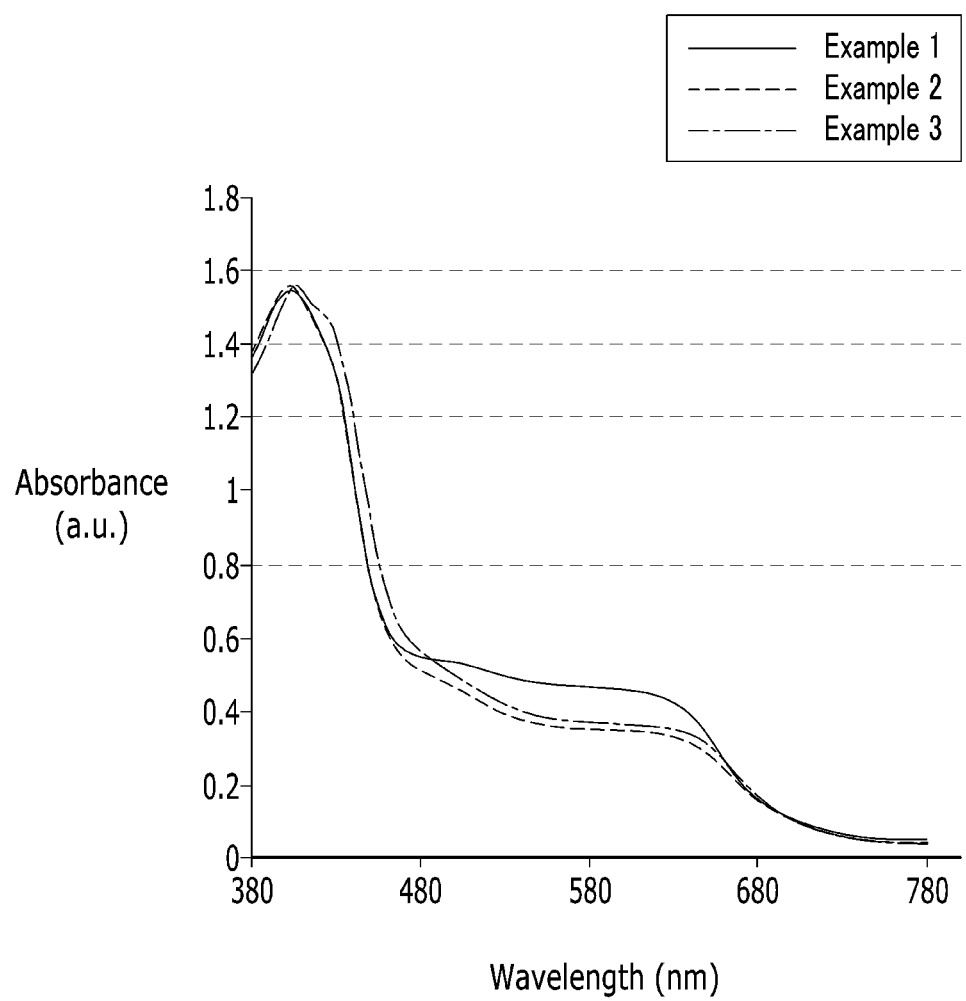
FIG. 6 is a graph of absorbance (arbitrary units, a.u.) versus wavelength (nanometers, nm), showing absorbance depending on a wavelength of the color polarizing films of Examples 1 to 3.
Figure 7:
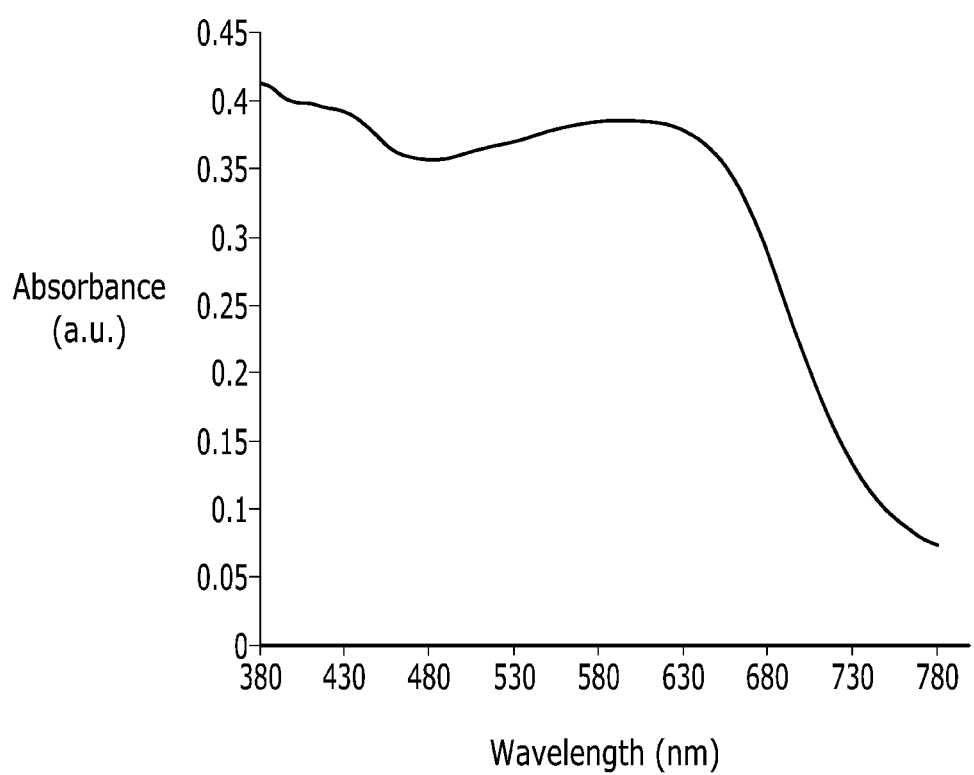
FIG. 7 is a graph of absorbance (arbitrary units, a.u.) versus wavelength (nanometers, nm), showing absorbance depending on a wavelength of the polarizing film of Comparative Example 1.

For the polarizing films obtained from Examples 1 to 3 and Comparative Example 1, absorbance depending on a wavelength is measured by a UV-VIS spectrophotometer (V-7100, JASCO Inc.). The results are shown in FIG. 6 and FIG. 7. FIG. 6 shows absorbance depending on a wavelength for the polarizing films of Examples 1 to 3, and FIG. 7 shows absorbance depending on a wavelength for the polarizing film of Comparative Example 1. When the color of the polarizing films is visually evaluated, the polarizing films according to Examples 1 to 3 appear gold, while the polarizing film according to Comparative Example 1 appears black.

Polarization efficiency of the polarizing films is obtained according to Equation 2.

$$PE\ (\%) = [(T_{//} - T_\perp)/(T_{//} + T_\perp)]^{1/2} \times 100 \quad \text{Equation 2}$$

In Equation 2,

PE is polarization efficiency of the polarizing film, $T_{//}$ is light transmittance of the color polarizing film of the polarizing film with respect to light entering parallel to the transmissive axis, and $T_\perp$ is light transmittance of the polarizing film with respect to light entering perpendicular to the transmissive axis.

$T_{//}$ and $T_\perp$ are measured by using a UV-VIS spectrophotometer (JASCO, V-7100).

The results are shown in Table 1.

405 nm and high polarization efficiency ranging from 90.8% to 94.9%. On the other hand, the polarizing film according to Comparative Example 1 appears black and shows an almost flat absorption peak in a visible light region (380 nm to 780 nm), and accordingly, the maximum absorption peak and the full width at half maximum (FWHM) of the polarizing film may not be determined.

Manufacture of Antireflective Film

Examples 4 to 6

Manufacture of Antireflective Film

Each color polarizing film obtained from Examples 1 to 3 and a circularly polarized light compensation film (λ/4 plate) are laminated to provide antireflective films according to Examples 4 to 6. As the circularly polarized light compensation film, a WRS film manufactured by Teijin is used.

Comparative Example 2

Manufacture of Antireflective Film

An antireflective film is prepared in accordance with the same procedure as in Examples 4 to 6, except that the polarizing film obtained from Comparative Example 1 is used instead of the polarizing films according to Examples 1 to 3.

Examples 7 to 9

Manufacture of Organic Light Emitting Diode (OLED) Display

A metallic anode, an organic emission layer including a light emitting material, a cathode including a transparent or a semi-transparent conductivity material, and a second substrate are sequentially stacked on a first glass substrate to provide an organic light emitting display panel. Subsequently, the circularly polarized light compensation film of the antireflective film obtained from each of Example 4 to 6 is attached to face the second substrate of the light emitting display panel to provide an organic light emitting diode (OLED) display.

Comparative Example 3

Manufacture of Organic Light Emitting Diode (OLED) Display

An organic light emitting diode (OLED) display is manufactured in accordance with the same procedure as in Examples 7 to 9, except that the antireflective film obtained from Comparative Example 2 is used instead of the antireflective films obtained from Examples 4 to 6.

While this disclosure has been described in connection with what is presently considered to be practical exemplary embodiments, it is to be understood that the disclosure is not limited to the present embodiments, but, on the contrary, is intended to cover various modifications and equivalent arrangements included within the spirit and scope of the appended claims.

What is claimed is:

1. A color polarizing film consisting essentially of:
a first layer comprising a first polymer and a first dichroic dye having an absorption wavelength region in the region from about 380 nanometers to about 780 nanometers, and
a second layer comprising a second polymer and a second dichroic dye having an absorption wavelength region in the region from about 380 nanometers to about 780 nanometers, wherein the second layer is disposed on the first layer,
wherein a polarization axis of the first layer and a polarization axis of the second layer cross each other,
wherein the color polarizing film exhibits a single maximum absorption wavelength ($\lambda_{max}$) in a wavelength range of about 380 nanometers to about 780 nanometers, and
wherein an absorption peak at the maximum absorption wavelength ($\lambda_{max}$) of the color polarizing film has a full width at half maximum of less than or equal to about 300 nanometers, and
wherein the color polarizing film absorbs unpolarized light and produces only a single color polarized light.

2. The color polarizing film of claim 1, wherein an absorption peak at the maximum absorption wavelength ($\lambda_{max}$) has a full width at half maximum of about 100 nm to about 250 nm.

3. The color polarizing film of claim 1, wherein the color polarizing film realizes a color in an off-state of a display device when the color polarizing film is applied to the display device.

4. The color polarizing film of claim 1, wherein the first polymer and the second polymer are independently selected from a polyolefin, a polyamide, a polyester, a polyacrylate, a polymethacrylate, a styrene-containing polymer, a polycarbonate, a vinyl chloride-based polymer, a polyimide, a polysulfone, a polyethersulfone, a polyether ether ketone, a polyphenylene sulfide, a polyvinyl alcohol, a polyvinylidene chloride, a polyvinyl butyral, a polyarylate, a polyoxymethylene, an epoxy polymer, a copolymer thereof, and a combination thereof.

5. The color polarizing film of claim 1, wherein the first polymer and the second polymer are independently selected from polyethylene, polypropylene, polyethylene terephthalate, polybutylene terephthalate, glycol modified polyethylene terephthalate, polyethylene naphthalate, nylon, a copolymer thereof, and a combination thereof.

6. The color polarizing film of claim 1, wherein at least one of the first dichroic dye or the second dichroic dye comprises one or more dichroic dyes having the same or different absorption wavelength regions.

7. The color polarizing film of claim 1,
wherein the first dichroic dye comprises at least one of a first dichroic dye (1A) having a maximum absorption wavelength in a wavelength range of about 380 nanometers to about 500 nanometers, a first dichroic dye (1B) having a maximum absorption wavelength in a wavelength range of greater than about 500 nanometers and less than or equal to about 580 nanometers, and a first dichroic dye (1C) having a maximum absorption wavelength in a wavelength range of greater than about 580 nanometers and less than or equal to about 780 nanometers, and
the second dichroic dye comprises at least one of a second dichroic dye (2A) having a maximum absorption wavelength in a wavelength range of about 380 nanometers to about 500 nanometers, a second dichroic dye (2B) having a maximum absorption wavelength in a wavelength range of greater than about 500 nanometers and less than or equal to about 580 nanometers, and a second dichroic dye (2C) having a maximum absorption wavelength in a wavelength range of greater than about 580 nanometers and less than or equal to about 780 nanometers.

8. The color polarizing film of claim 7, wherein the first dichroic dye (1A) comprises at least one of a first dichroic dye (1A-1) having a maximum absorption wavelength in a wavelength range of about 380 nanometers to about 400 nanometers and a first dichroic dye (1A-2) having a maximum absorption wavelength in a wavelength range of greater than about 400 nanometers and less than or equal to about 500 nanometers.

9. The color polarizing film of claim 7, wherein the first dichroic dye (1B) comprises at least one of a first dichroic dye (1B-1) having a maximum absorption wavelength in a wavelength range of greater than about 500 nanometers and less than or equal to about 560 nanometers and a first dichroic dye (1B-2) having a maximum absorption wavelength in a wavelength range of greater than about 560 nanometers and less than or equal to about 580 nanometers.

10. The color polarizing film of claim 7, wherein the first dichroic dye (1C) comprises at least one of a first dichroic dye (1C-1) having a maximum absorption wavelength in a wavelength range of greater than about 580 nanometers and less than or equal to about 620 nanometers and a first dichroic dye (1C-2) having a maximum absorption wavelength in a wavelength range of greater than about 620 nanometers and less than or equal to about 780 nanometers.

11. The color polarizing film of claim 7, wherein the second dichroic dye (2A) comprises at least one of a second dichroic dye (2A-1) having a maximum absorption wavelength in a wavelength range of about 380 nanometers to about 400 nanometers and a second dichroic dye (2A-2) having a maximum absorption wavelength in a wavelength range of greater than about 400 nanometers and less than or equal to about 500 nanometers.

12. The color polarizing film of claim 7, wherein the second dichroic dye (2B) comprises at least one of a second dichroic dye (2B-1) having a maximum absorption wavelength in a wavelength range of greater than about 500 nanometers and less than or equal to about 560 nanometers and a second dichroic dye (2B-2) having a maximum absorption wavelength in a wavelength range of greater than about 560 nanometers and less than or equal to about 580 nanometers.

13. The color polarizing film of claim 7, wherein the second dichroic dye (2C) comprises at least one of a second dichroic dye (2C-1) having a maximum absorption wavelength in a wavelength range of greater than about 580 nanometers and less than or equal to about 620 nanometers and a second dichroic dye (2C-2) having a maximum absorption wavelength in a wavelength range of greater than about 620 nanometers and less than or equal to about 780 nanometers.

14. The color polarizing film of claim 1, wherein the first dichroic dye and the second dichroic dye are independently a compound represented by Chemical Formula 1:

Chemical Formula 1

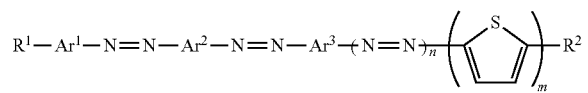

wherein, in Chemical Formula 1,
$Ar^1$ to $Ar^3$ are independently a substituted or unsubstituted C6 to C15 arylene group,
$R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof,
$R^2$ is selected from hydrogen, a substituted or unsubstituted C1 to C30 alkyl group, a substituted or unsubstituted C6 to C20 aryl group, a substituted or unsubstituted C3 to C20 heteroaryl group, —NR$^3$R$^4$, and a combination thereof, wherein $R^3$ and $R^4$ are independently hydrogen, or a substituted or unsubstituted C1 to C10 alkyl group, which are optionally linked to each other to provide a ring,
n is 0, 1, or 2, and
m is 0 or 1.

15. The color polarizing film of claim 14, wherein the compound represented by Chemical Formula 1 is at least one of a first dichroic dye (1A) having a maximum absorption wavelength in a wavelength range of about 380 nanometers to about 500 nanometers, a first dichroic dye (1B) having a maximum absorption wavelength in a wavelength range of greater than about 500 nanometers and less than or equal to about 580 nanometers, and a first dichroic dye (1C) having a maximum absorption wavelength in a wavelength range of greater than about 580 nanometers and less than or equal to about 780 nanometers, in accordance with the values of n, m, $R^1$, and $R^2$.

16. The color polarizing film of claim 15, wherein the first dichroic dye (1A) is the compound wherein in Chemical Formula 1,
n is 0 or 1,
m is 0,
$R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, or a combination thereof, and
$R^2$ is selected from hydrogen, a substituted or unsubstituted C1 to C30 alkyl group, —NR$^3$R$^4$, and a combination thereof, wherein $R^3$ and $R^4$ are independently hydrogen, or a substituted or unsubstituted C1 to C10 alkyl group, which are optionally linked to each other to provide a ring,
the first dichroic dye (1B) is the compound wherein in Chemical Formula 1,
n is 0 or 1,
m is 1,
$R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), 13 O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and
$R^2$ is selected from hydrogen, a substituted or unsubstituted C1 to C30 alkyl group, a substituted or unsubstituted C6 to C20 aryl group, —NR$^3$R$^4$, and a combination thereof, wherein $R^3$ and $R^4$ are independently hydrogen, or a substituted or unsubstituted C1 to C10 alkyl group, which are optionally linked to each other to provide a ring,
the first dichroic dye (1C) is the compound wherein in Chemical Formula 1,
n is 1 or 2,
m is 1,
$R^1$ is selected from a substituted or unsubstituted C1 to C30 alkyl group, a substituted or unsubstituted C1 to C20 alkoxy group, a substituted or unsubstituted C1 to C20 alkylthio group, —(C=O)R (wherein R is a substituted or unsubstituted C1 to C30 alkyl group), —O(C=O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and $R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

17. The color polarizing film of claim 14, wherein the compound represented by Chemical Formula 1 is at least one of a second dichroic dye (2A) having a maximum absorption wavelength in a wavelength range of about 380 nanometers to about 500 nanometers, a second dichroic dye (2B) having a maximum absorption wavelength in a wavelength range of greater than about 500 nanometers and less than or equal to about 580 nanometers, and a second dichroic dye (2C) having a maximum absorption wavelength in a wavelength range of greater than about 580 nanometers and less than or equal to about 780 nanometers, in accordance with the values of n, m, $R^1$, and $R^2$.

18. The color polarizing film of claim 17, wherein the second dichroic dye (2A) is the compound wherein in Chemical Formula 1,
n is 0 or 1,
m is 0,
$R^1$ is selected from a substituted or unsubstituted C1 to C30 alkyl group, a substituted or unsubstituted C1 to C20 alkoxy group, a substituted or unsubstituted C1 to C20 alkylthio group, —(C═O)R (wherein R is a substituted or unsubstituted C1 to C30 alkyl group), —O(C═O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and
$R^2$ is selected from hydrogen, a substituted or unsubstituted C1 to C30 alkyl group, —$NR^3R^4$, and a combination thereof, wherein $R^3$ and $R^4$ are independently hydrogen, or a substituted or unsubstituted C1 to C10 alkyl group, which are optionally linked to each other to provide a ring, the second dichroic dye (2B) is the compound wherein in Chemical Formula 1,
n is 0 or 1,
m is 1,
$R^1$ is selected from a substituted or unsubstituted C1 to C30 alkyl group, a substituted or unsubstituted C1 to C20 alkoxy group, a substituted or unsubstituted C1 to C20 alkylthio group, —(C═O)R (wherein R is a substituted or unsubstituted C1 to C30 alkyl group), —O(C═O)R (wherein R is a substituted or unsubstituted C1 to C30 alkyl group), a substituted or unsubstituted C2 to C20 alkenyl group, a substituted or unsubstituted C2 to C30 alkynyl group, and a combination thereof, and
$R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring, and
the second dichroic dye (2C) is the compound wherein in Chemical Formula 1,
n is 1 or 2,
m is 1,
$R^1$ is selected from a substituted or unsubstituted C1 to C30 alkyl group, a substituted or unsubstituted C1 to C20 alkoxy group, a substituted or unsubstituted C1 to C20 alkylthio group, —(C═O)R (wherein R is a substituted or unsubstituted C1 to C30 alkyl group), —O(C═O)R (wherein R is a substituted or unsubstituted C1 to C30 alkyl group), a substituted or unsubstituted C2 to C20 alkenyl group, a substituted or unsubstituted C2 to C30 alkynyl group, or a combination thereof, and
$R^2$ is selected from hydrogen, a substituted or unsubstituted C1 to C30 alkyl group, a substituted or unsubstituted C6 to C20 aryl group, —$NR^3R^4$, and a combination thereof, wherein $R^3$ and $R^4$ are independently hydrogen, or a substituted or unsubstituted C1 to C10 alkyl group, which are optionally linked to each other to provide a ring.

19. The color polarizing film of claim 1,
wherein when the first dichroic dye comprises the first dichroic dye (1A) having a maximum absorption wavelength in a wavelength range of about 380 nanometers to about 500 nanometers, the first layer has light transmittance of about 60% to about 85%, and the second layer has light transmittance of greater than or equal to about 30%.

20. The color polarizing film of claim 19, wherein a ratio ($T_1/T_2$) of the light transmittance ($T_1$) of the first layer relative to the light transmittance ($T_2$) of the second layer ranges from about 0.3 to about 0.9.

21. The color polarizing film of claim 1, wherein when the first dichroic dye comprises the first dichroic dye (1B) having a maximum absorption wavelength in a wavelength range of greater than about 500 nanometers and less than or equal to about 580 nanometers, the first dichroic dye (1C) having a maximum absorption wavelength in a wavelength range of greater than about 580 nanometers and less than or equal to about 780 nanometers, or a combination thereof, the first layer has light transmittance of about 30% to about 50%, and the second layer has light transmittance of greater than or equal to about 60%.

22. The color polarizing film of claim 21, wherein a ratio ($T_1/T_2$) of the light transmittance ($T_1$) of the first layer relative to the light transmittance ($T_2$) of the second layer ranges from about 0.3 to about 0.9.

23. The color polarizing film of claim 1, wherein the color polarizing film has polarization efficiency of about 85% to about 95%.

24. The color polarizing film of claim 1, wherein the color polarizing film has light transmittance of about 35% to about 45%.

25. The color polarizing film of claim 1, wherein an amount of the first dichroic dye is about 0.01 to about 10 parts by weight based on 100 parts by weight of the first polymer.

26. The color polarizing film of claim 1, wherein an amount of the second dichroic dye is about 0.01 to about 10 parts by weight based on 100 parts by weight of the second polymer.

27. The color polarizing film of claim 1, wherein the first layer of the color polarizing film is made of a melt blend of the first polymer and the first dichroic dye and the second layer is made of a melt blend of the second polymer and the second dichroic dye.

28. An antireflective film, comprising:
the color polarizing film of claim 1; and
a compensation film.

29. The antireflective film of claim 28, wherein the compensation film is a λ/4 plate.

30. An organic light emitting diode (OLED) display, comprising:

a display panel; and an antireflective film disposed on at least one surface of the display panel, wherein, the antireflective film comprises a color polarizing film and a compensation film, wherein the color polarizing film consists essentially of:

a first layer comprising a first polymer and a first dichroic dye having an absorption wavelength region in a region from about 380 nanometers to about 780 nanometers, and a second layer comprising a second polymer and a second dichroic dye having an absorption wavelength region in a region from about 380 nanometers to about 780 nanometers, wherein the second layer is disposed on the first layer, wherein a polarization axis of the first layer and a polarization axis of the second layer cross each other, wherein the color polarizing film exhibits a single maximum absorption wavelength ($\lambda_{max}$) in a wavelength range of about 380 nanometers to about 780 nanometers, wherein an absorption peak at the maximum absorption wavelength ($\lambda_{max}$) has a full width at half maximum of less than or equal to about 300 nanometers, and wherein the color polarizing film absorbs unpolarized light and produces only a single color polarized light.

* * * * *